US009263449B2

(12) United States Patent
Cheng et al.

(10) Patent No.: US 9,263,449 B2
(45) Date of Patent: Feb. 16, 2016

(54) FINFET AND FIN-PASSIVE DEVICES

(71) Applicant: International Business Machines Corporation, Armonk, NY (US)

(72) Inventors: Kangguo Cheng, Schenectady, NY (US); Ramachandra Divakaruni, Ossining, NY (US); Ali Khakifirooz, Los Altos, CA (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/830,182

(22) Filed: Aug. 19, 2015

(65) Prior Publication Data

US 2015/0357331 A1 Dec. 10, 2015

Related U.S. Application Data

(62) Division of application No. 14/272,771, filed on May 8, 2014.

(51) Int. Cl.
*H01L 21/70* (2006.01)
*H01L 27/092* (2006.01)
*H01L 29/06* (2006.01)
*H01L 49/02* (2006.01)

(52) U.S. Cl.
CPC ............ *H01L 27/0924* (2013.01); *H01L 28/00* (2013.01); *H01L 29/0649* (2013.01)

(58) Field of Classification Search
CPC ............... H01L 21/823431; H01L 21/823821; H01L 21/845; H01L 27/0886; H01L 27/0924; H01L 27/10826; H01L 27/10879; H01L 27/1211; H01L 29/41791; H01L 29/66772; H01L 29/7831; H01L 29/785; H01L 2029/7858; H01L 2924/13067
See application file for complete search history.

(56) References Cited

U.S. PATENT DOCUMENTS

| | | | |
|---|---|---|---|
| 7,994,020 B2 | 8/2011 | Lin et al. | |
| 8,183,627 B2 | 5/2012 | Currie | |
| 8,273,610 B2 | 9/2012 | Or-Bach et al. | |
| 8,273,617 B2 | 9/2012 | Thompson et al. | |
| 8,293,616 B2 | 10/2012 | Chang et al. | |
| 8,304,823 B2 | 11/2012 | Boescke | |
| 8,679,924 B2 * | 3/2014 | Wei | H01L 29/66795 257/E21.014 |
| 8,753,940 B1 * | 6/2014 | Wei | H01L 21/823431 257/E21.429 |
| 8,906,807 B2 * | 12/2014 | Bergendahl | H01L 21/3086 438/197 |

(Continued)

FOREIGN PATENT DOCUMENTS

EP 2528061 A2 11/2012

*Primary Examiner* — Thanh Y Tran
(74) *Attorney, Agent, or Firm* — Steven J. Meyers; Howard M. Cohn

(57) ABSTRACT

A method of forming a semiconductor structure within a semiconductor substrate is provided. The method may include forming, on the substrate, a first group of fins associated with a first device; a second group of fins associated with a second device; and a third group of fins located between the first group of fins and the second group of fins, whereby the third group of fins are associated with a third device. A shallow trench isolation (STI) region is formed between the first and the second group of fins by recessing the third group of fins into an opening within the substrate, such that the recessed third group of fins includes a fin top surface that is located below a top surface of the substrate. The top surface of the substrate is substantially coplanar with a fin bottom surface corresponding to the first and second group of fins.

2 Claims, 17 Drawing Sheets

(56) References Cited

U.S. PATENT DOCUMENTS

| | | | | |
|---|---|---|---|---|
| 8,912,606 B2* | 12/2014 | Baldauf | ......... | H01L 21/823807 257/368 |
| 9,093,496 B2* | 7/2015 | Jacob | ................ | H01L 21/76243 |
| 2005/0202608 A1* | 9/2005 | Beintner | ............... | H01L 29/785 438/164 |
| 2012/0220102 A1 | 8/2012 | Or-Bach et al. | | |
| 2012/0248595 A1 | 10/2012 | Or-Bach et al. | | |
| 2012/0281478 A1 | 11/2012 | Lue et al. | | |
| 2012/0306082 A1 | 12/2012 | Sekar et al. | | |
| 2012/0313227 A1 | 12/2012 | Or-Bach et al. | | |
| 2012/0327719 A1 | 12/2012 | Luc | | |
| 2015/0017781 A1* | 1/2015 | Lin | .................. | H01L 21/76224 438/424 |
| 2015/0102409 A1* | 4/2015 | Cheng | ................... | H01L 21/845 257/347 |

\* cited by examiner

FINFET AND FIN-PASSIVE DEVICES

CROSS REFERENCE TO RELATED APPLICATIONS

This application is a division of commonly-owned, copending U.S. patent application Ser. No. 14/272,771 entitled FINFET AND FIN-PASSIVE DEVICES, and filed on May 8, 2014.

BACKGROUND

The present invention generally relates to semiconductor devices, and more particularly, to structures, fabrication methods, and design structures associated with active and passive fin-based devices.

A fin metal-oxide-semiconductor field effect transistor (finMOSFET, or finFET) may provide solutions to metal-oxide-semiconductor field effect transistor (MOSFET) scaling problems at and below, for example, the 22 nanometer (nm) node of semiconductor technology. A finFET includes at least one narrow semiconductor fin (preferably <30 nm wide) gated on at least two opposing sides of each of the at least one semiconductor fin. FinFET structures may, for example, typically be formed on either a semiconductor-on-insulator (SOI) substrate or a bulk semiconductor substrate.

A feature of a finFET is a gate electrode located on at least two sides of the channel formed along the longitudinal direction of the fin. Due to the advantageous feature of full depletion in the fin structure, the increased number of sides (e.g., two or three) on which the gate electrode controls the channel of the finFET enhances the controllability of the channel in a finFET compared to a planar MOSFET. The improved control of the channel, among other things, allows smaller device dimensions with less short channel effects as well as larger electrical current that can be switched at high speeds.

Based on, among other things, the characteristics mentioned above, the incorporation of finFET structures within integrated circuits beyond 22 nm nodes (i.e., <22 nm) is becoming more prevalent. While finFET structures provide improved scalability, CMOS technologies may require both active finFET devices (e.g., pFETs and nFETs) and passive devices (e.g., electrostatic discharge diodes, decoupling capacitors, resistors, inductors, etc.) within a single design. However, passive devices usually occupy a substantial area (i.e., real estate) within a semiconductor chip, thus contributing to reducing the device density within the semiconductor chip.

SUMMARY

Therefore, according to at least one embodiment, a shallow trench isolation (STI) region located between finFET devices may be utilized to form embedded passive devices, thereby, among other things, enhancing device density in favor of an increased usage of chip area real estate.

According to at least one exemplary embodiment, a method of forming a semiconductor structure within a semiconductor substrate is provided. The method may include forming, on the semiconductor substrate, a first group of fins associated with a first device; forming, on the semiconductor substrate, a second group of fins associated with a second device; and forming, on the semiconductor substrate, a third group of fins located between the first group of fins and the second group of fins, whereby the third group of fins are associated with a third device. A shallow trench isolation (STI) region is formed between the first group of fins and the second group of fins by recessing the third group of fins into an opening within the semiconductor substrate, such that the recessed third group of fins includes a fin top surface that is located below a top surface of the semiconductor substrate. Further, the top surface of the semiconductor substrate is substantially coplanar with a fin bottom surface corresponding to the first and the second group of fins.

According to at least one other exemplary embodiment, a semiconductor structure may include a semiconductor substrate, a first group of fins associated with a first device that are located on the semiconductor substrate, and a second group of fins associated with a second device that are also located on the semiconductor substrate. A shallow trench isolation (STI) region having a trench opening within the semiconductor substrate is also included, whereby the trench opening is located between the first group of fins and the second group of fins. A third group of fins associated with a third device is located within the trench opening, such that the third group of fins include a fin top surface located below a top surface of the semiconductor substrate. The top surface of the semiconductor substrate is substantially coplanar with a fin bottom surface corresponding to the first and the second group of fins, while the third device is embedded within the trench opening.

According to yet another exemplary embodiment, a method of forming a semiconductor structure within a semiconductor substrate is provided. The method may include forming, on the semiconductor substrate, a first group of fins associated with a first device; forming, on the semiconductor substrate, a second group of fins associated with a second device; forming, on the semiconductor substrate, a third group of fins located between the first group of fins and the second group of fins; and forming, on the semiconductor substrate, a fourth group of fins associated with a fourth device. The fourth group of fins are located between the first group of fins and the second group of fins, and the third and fourth group of fins are substantially adjacent. A dielectric layer is deposited over the first, the second, the third, and the fourth group of fins. Using a first cut mask, the third group of fins and a portion of the semiconductor substrate located below the third group of fins are then etched to form a first shallow trench isolation (STI) region. Using a second cut mask, the fourth group of fins are etched to recess the fourth group of fins into an opening within the semiconductor substrate to form a second shallow trench isolation (STI) region substantially adjacent to the first STI region. The recessed fourth group of fins have a fin top surface located below a fin bottom surface corresponding to each of the first and the second group of fins.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following described and illustrated exemplary structures and processes include utilizing an STI region between finFET devices (e.g., nFET and pFET) to create embedded passive devices (e.g., capacitors, diodes, etc.). Particularly, a fin structure embedded within the STI structure may be utilized to form passive devices such as, but not limited to, a capacitor or diode device that is also embedded within the STI structure. A block mask used to recess exposed regions may form a non-coplanar array of (buried) fins. Moreover, multiple cut masks (i.e., multiple color masks) may be used to form buried fin regions at the same time as forming other device isolation regions (i.e., STIs).

FIGS. 1A-1G are cross sectional views corresponding to the fabrication of a semiconductor structure having active finFET devices and a passive capacitor device, according to one exemplary embodiment.

Figure 1A:
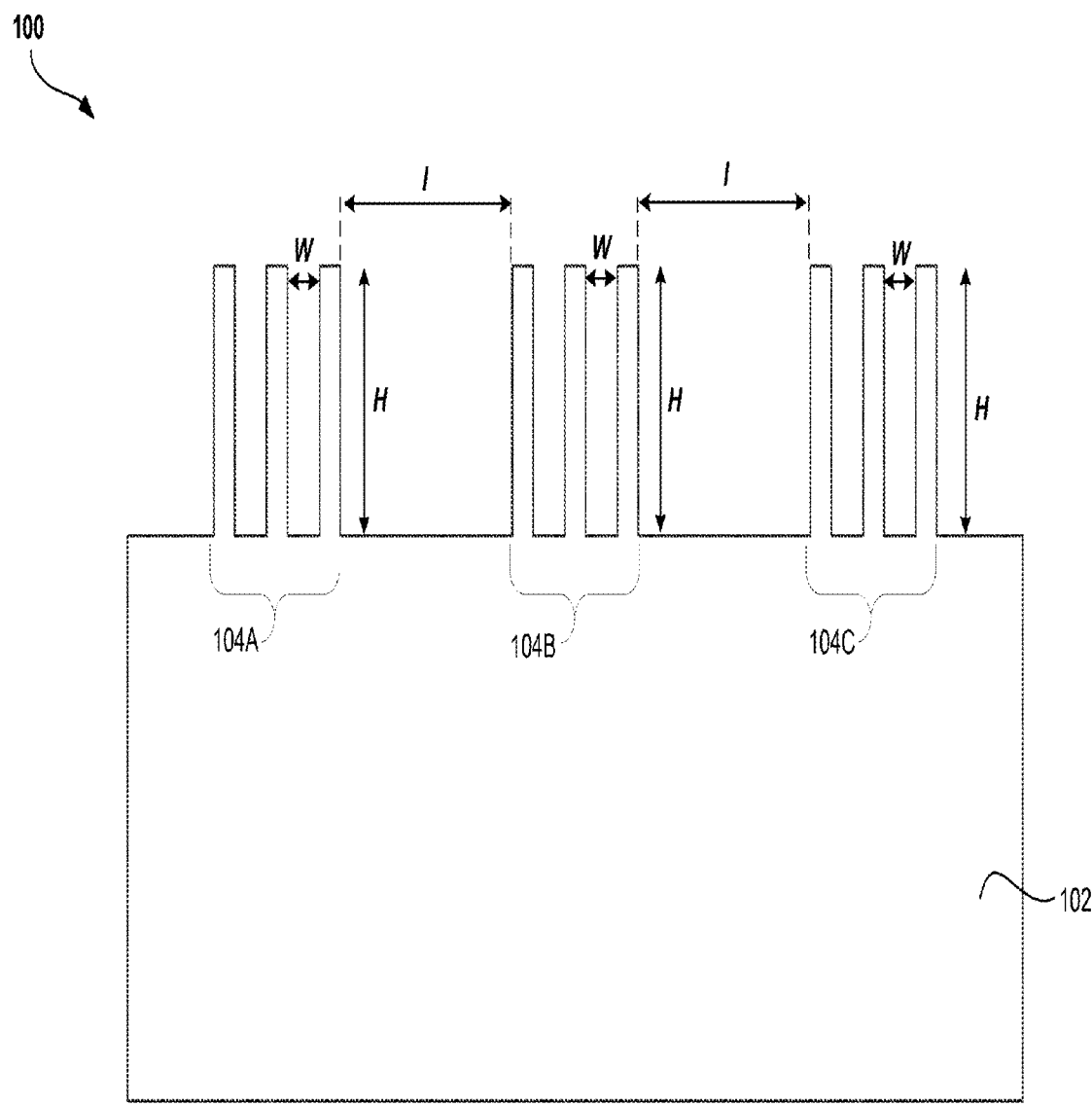
FIG. 1A illustrates a cross-sectional view of a semiconductor structure that includes a fabricated group of fins on a bulk semiconductor substrate, according to one exemplary embodiment.

Referring to FIG. 1A, a semiconductor structure 100 including a fabricated group of fins 104A-104C (i.e., 3 fins per group) on a bulk semiconductor substrate 102 according to one exemplary embodiment is depicted. It may be appreciated that in addition to a bulk semiconductor substrate 102, any other suitable substrate and/or substrate material may be used to form the group of fins 104A-104C. For example, semiconductor substrate 102 can be a bulk wafer formed of any conventional semiconductor substrate material including, but not limited to, silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and together summing to 1. Other suitable substrates may include II-VI compound semiconductors having a composition $Zn_{A1}Cd_{A2}Se_{B1}Te_{B2}$, where A1, A2, B1, and B2 are relative proportions each greater than or equal to zero and sum to 1. Other substrates used to form semiconductor structure 100 may, for example, include silicon-on-insulator (SOI) substrates.

As depicted in FIG. 1A, each of the fins corresponding to the group of fins 104A-104C (i.e., 3 fins per group) may have a height H in the range of about 30 nm-100 nm, although lesser or greater heights may be contemplated. Further, each of the fins corresponding to the group of fins 104A-104C (i.e., 3 fins per group) may have a width W in the range of about 5 nm-30 nm, although lessor or greater widths may be contemplated. The interval or separation S between each of the fins corresponding to the group of fins 104A-104C (i.e., 3 fins per group) may be about 10 nm-100 nm, although lessor or greater separations may be contemplated. The group of fins 104A-104C (i.e., 3 fins per group) may be created using know fabrication techniques. For example, fins 104A-104C may be formed from substrate 102 using a sidewall image transfer (SIT) fabrication process. Thus, lithographic patterning and reactive ion etching (RIE) techniques may be utilized. For illustrative non-limiting purposes, three (3) groups 104A-104C each having three fins are fabricated. However, any number of fin groups may be contemplated. The group 104A-104C may be separated by an interval separation I of about 30 nm-500 nm, although lessor or greater interval separations may be contemplated.

Figure 1B:
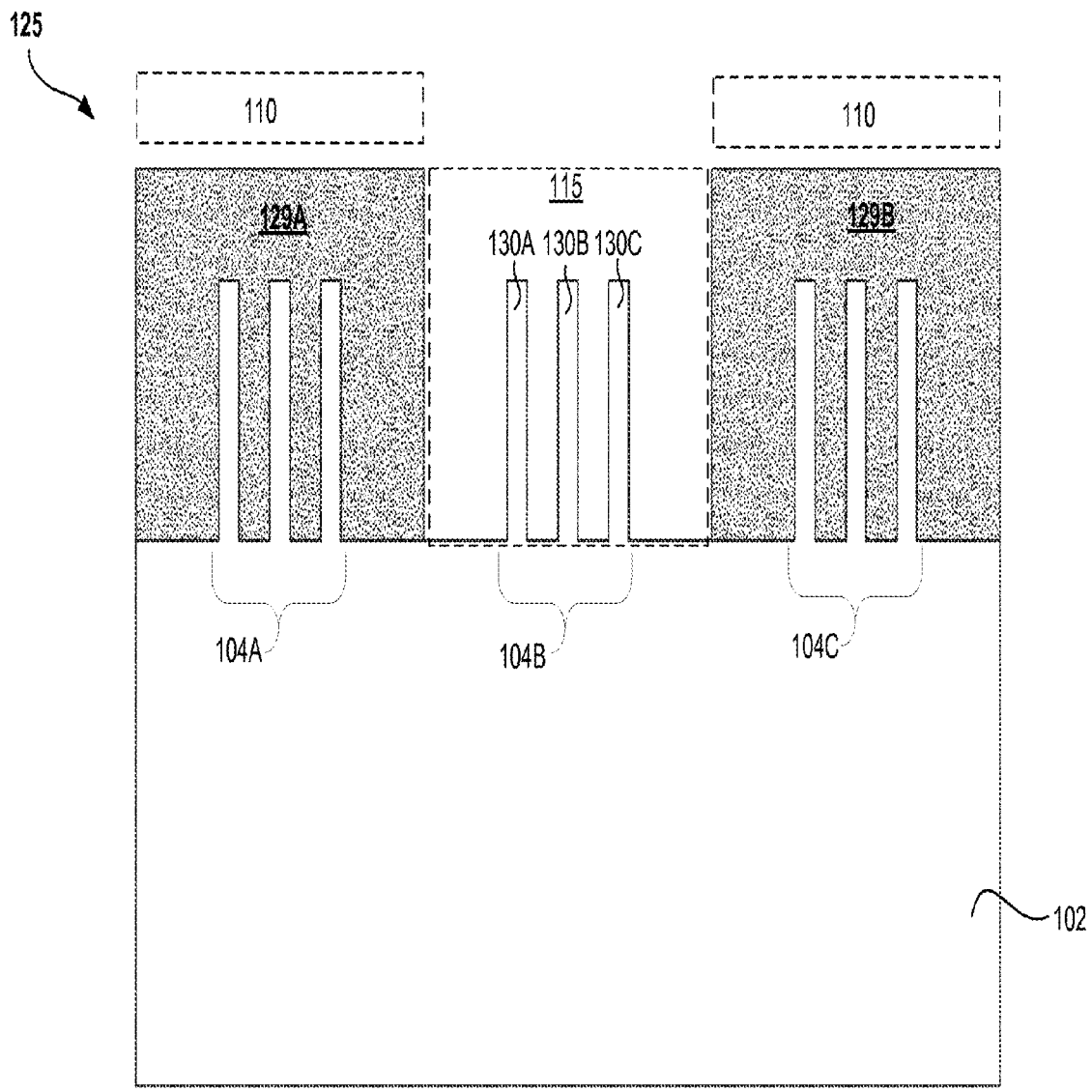
FIG. 1B illustrates a cross-sectional view of a semiconductor structure formed by applying a patterned hardmask to the semiconductor structure of FIG. 1A, according to one exemplary embodiment.

Referring to FIG. 1B, semiconductor structure 125 may be formed by applying a patterned hardmask 129A, 129B to the semiconductor structure 100 depicted in FIG. 1A according to one exemplary embodiment. As illustrated, a cut mask 110 may be used to form pattern hardmask regions 129A and 129B, whereby the hardmask regions 129A, 129B, for example, include a silicon nitride material ($Si_3N_4$). In particular, hardmask region 129A covers group of fins 104A, while hardmask region 129B covers group of fins 104C. The photolithographic process, however, exposes region 115, which includes group of fins 104B. Based on exposing silicon nitride region 115, a dry etch process such as RIE, or a wet etch using phosphoric acid ($H_3PO_4$) may be utilized to remove the hardmask material (e.g., $Si_3N_4$) from region 115. In the depicted embodiment, group of fins 104A and 104C, which are protected by respective hardmask regions 129A and 129B, may subsequently be used to form the active fins of finFET devices. Group of fins 104B, which is exposed following the selective-to-silicon etching of silicon nitride region 115, may subsequently be used to form embedded passive devices such as capacitors and diodes.

Figure 1C:
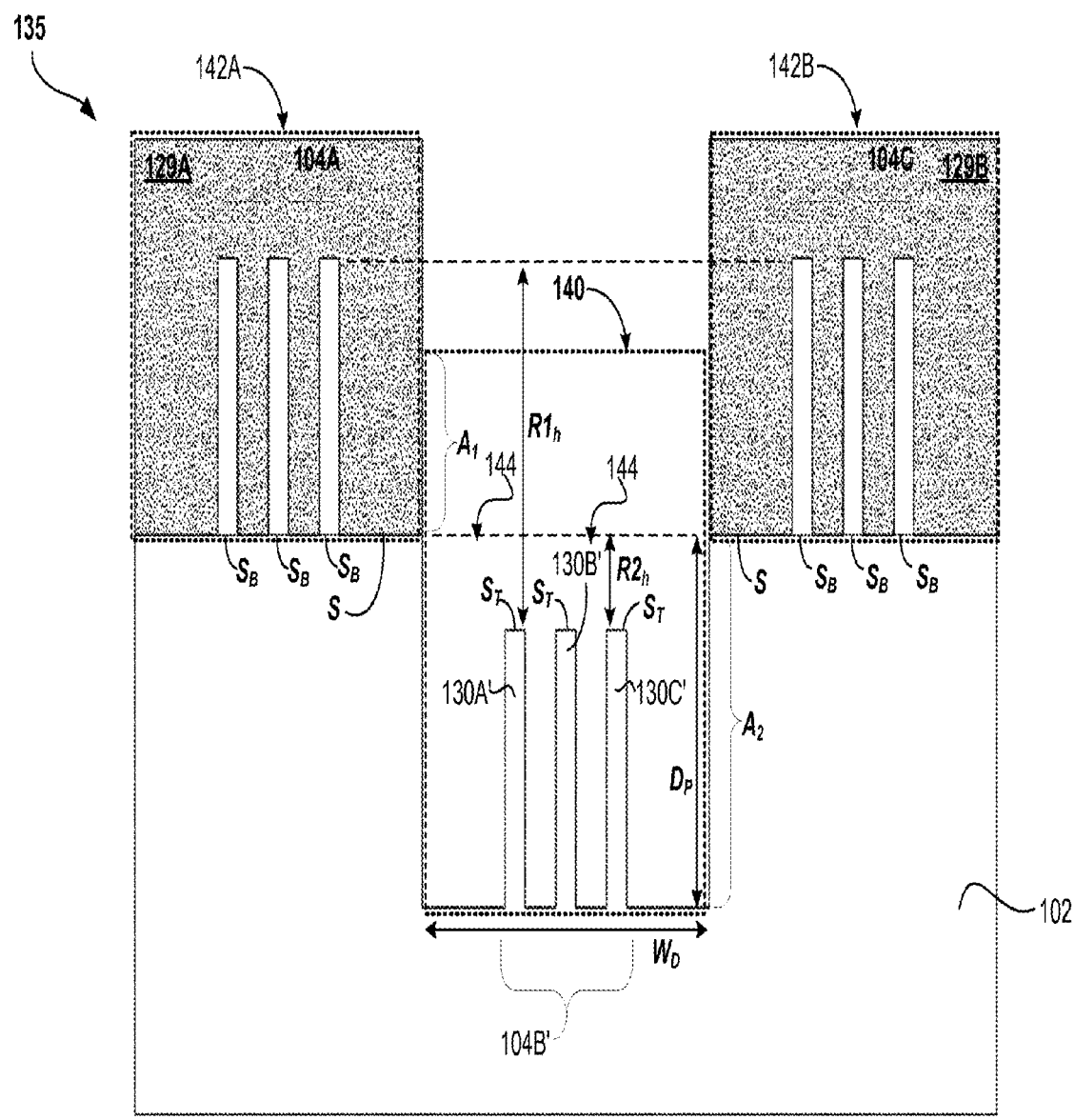
FIG. 1C illustrates a cross-sectional view of a semiconductor structure formed by recessing an exposed group fins within the semiconductor structure of FIG. 1B, according to one exemplary embodiment.

Referring to FIG. 1C, semiconductor structure 135 may be formed by recessing the passive fins 130A-130C (FIG. 1B) corresponding to the exposed group of fins 104B (FIG. 1B) of semiconductor structure 125 depicted in FIG. 1B according to one exemplary embodiment. In particular, FIG. 1C shows recessed passive fins 130A'-130C' corresponding to recessed group of fins 104B'. Using a silicon RIE etching process, the passive fins 130A'-130C' are recessed by height $R1_h$ (e.g., 70 nm-220 nm or more) such that the top surfaces $S_T$ of the passive fins 130A'-130C' are now located below the bottom surfaces $S_B$ of the active group of fins 104A, 104C protected by hardmask regions 129A and 129B. For example, as depicted, the top surfaces $S_T$ of the passive fins 130A'-130C' may be located below the bottom surfaces $S_B$ of the active group of fins 104A, 104C by height $R2_h$ (e.g., 20 nm or more). The bottom surfaces $S_B$ of the active group of fins 104A, 104C may coincide with the top surface S of the semiconductor substrate 102 such that surface S and $S_B$ exist on the same plane (i.e., coplanar).

As illustrated in FIG. 1C, region 140 may be used to subsequently form an STI region for electrically isolating region 142A having active group of fins 104A from region 142B having active group of fins 104C. Thus, the recessed passive fins 130A'-130C' of the recessed group of fins 104B' are created within the STI region 140. The recessed group of fins 104B' are, therefore, embedded as a result being located below the bottom surfaces $S_B$ of the active group of fins 104A, 104C and below the top surface S of the semiconductor substrate 102. Due to the embedding of the recessed group of fins 104B', the recessed passive fins 130A'-130C' are thus located both within opening 144 of the semiconductor substrate 102 and below the top surface S of the semiconductor substrate 102. The STI region 140 may include an upper region, as indicated by $A_1$, and a lower region corresponding to trench opening 144 (i.e., STI trench), as determined by $A_2$. As depicted, the embedded group of fins 104B' within opening 144 is, therefore, located within the lower area $A_2$ of STI region 140. In particular, the embedded group of fins 104B' are located within and embedded by the trench opening or STI trench 144. Opening 144 may, for example, include a width $W_D$ of about 100 nm to 7000 nm and a depth $D_P$ of about 50-200 nm. The recessed group of fins 104B' embedded within STI trench 144 provide a three dimensional structure that enable the fabrication passive devices in relatively more confined spaces. For example, the passive fins 130A'-130C' may facilitate an increase in the surface area of capacitor plates compared to those implemented as a planar structure. Fins 104B' may have a height similar to (as shown) or less than the height of fin groups 104A and 104C, depending on the recess process condition.

Figure 1D:
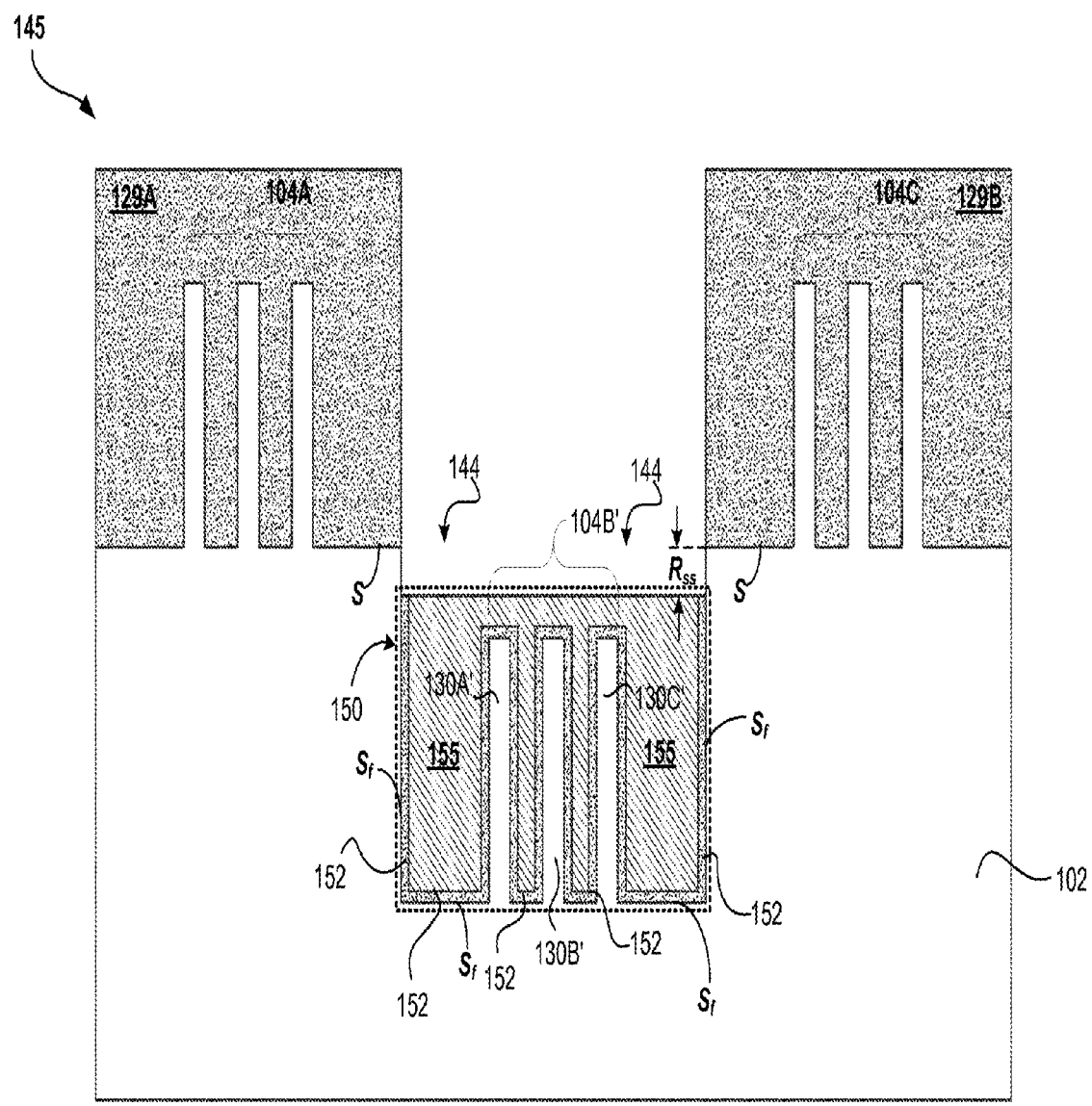
FIG. 1D illustrates a cross-sectional view of a semiconductor structure formed by creating a buried capacitor within the recessed group of fins of the semiconductor structure of FIG. 1C, according to one exemplary embodiment.

Referring to FIG. 1D, semiconductor structure 145 may be formed by creating a buried capacitor 150 using the embedded passive fins 130A'-130C' (FIG. 1C) corresponding to the recessed group of fins 104B' (FIG. 1C) of semiconductor structure 135 (FIG. 1C) according to one exemplary embodiment. As depicted, a dielectric material such as a high-k dielectric material layer 152 is deposited over the surfaces of the embedded passive fins 130A'-130C' and the surfaces $S_f$ (i.e., sidewalls and floor) of the semiconductor substrate's 102 opening 144. Thus, the high-k dielectric material layer 152 is deposited over the surfaces of the embedded passive fins 130A'-130C' and the surfaces $S_f$ (i.e., sidewalls and floor) of opening 144 within the lower area $A_2$ of STI region 140.

Examples of high-k materials may include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, and lead scandium tantalum oxide. The high-k dielectric material layer 152 may include a thickness of about 20 Angstroms (Å) to about 1000 Å, although greater or lesser thicknesses may be contemplated based on the desired capacitance value and/or dielectric material used. It may be appreciated that the high-k dielectric material layer 152 may be deposited using various deposition techniques such as, but not limited to, chemical vapor deposition (CVD), plasma enhanced chemical vapor deposition (PECVD), sub-atomic chemical vapor deposition (SACVD), etc. It may, however, also be appreciated that theses deposition techniques (i.e., CVD, SACVD, PECVD, etc.), or any other deposition processes conventionally utilized, may be applied for depositing the various material layers corresponding to the different embodiments (i.e., FIGS. 1-4) described herein.

As further shown in FIG. 1D, following the deposition of the high-k dielectric material layer 152, the opening 144 is substantially filled by depositing a doped polysilicon or metal fill material 155 (e.g., tungsten, titanium, tantalum, ruthenium, zirconium, cobalt, copper, aluminum, platinum, tin, silver, gold, etc.) over the high-k dielectric material layer 152. In the depicted embodiment, a decoupling capacitor may be formed, whereby the embedded passive fins 130A'-130C' form a first capacitor plate (e.g., grounded plate), the high-k dielectric material layer 152 forms the capacitor dielectric, and the doped polysilicon or metal fill material 155 forms the second capacitor plate (e.g., $V_{DD}$ plate). As depicted, the formed decoupling capacitor 150 is embedded within the trench opening or STI trench 144, whereby the top portion of the capacitor, which corresponds to the doped polysilicon or metal fill material 155 forming the second capacitor plate, is located below the top surface S of the semiconductor substrate 102 by recess depth $R_{ss}$.

Figure 1E:
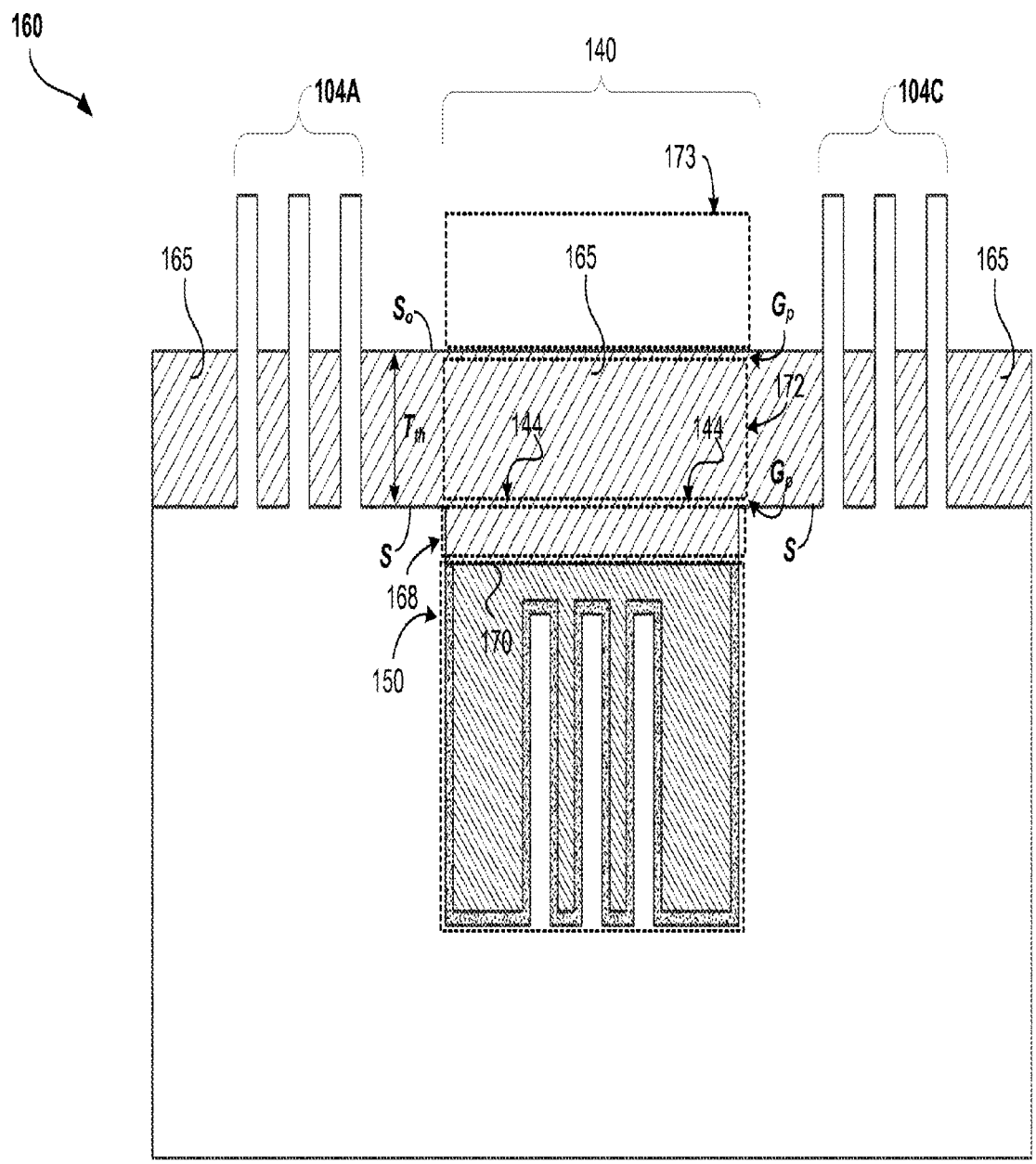
FIG. 1E illustrates a cross-sectional view of a semiconductor structure formed by depositing a shallow trench isolation (STI) fill material over the semiconductor structure of FIG. 1D, according to one exemplary embodiment.

Referring to FIG. 1E, semiconductor structure 160 may be formed by depositing a STI fill material 165 over both the buried capacitor 150 and the group of fins 104A, 104C of semiconductor structure 145 (FIG. 1D) according to one exemplary embodiment. As depicted, prior to conformally depositing the STI fill material 165 over both the buried capacitor 150 and the group of fins 104A, 104C, the hardmask regions 129A, 129B (FIG. 1D) are removed using either a RIE or wet etch process. Particularly, the deposited STI fill material 165 occupies a recess region 168 within STI trench 144 that is located between the top 170 of the capacitor 150 and the top surface S of the semiconductor substrate 102. In addition, the STI fill material 165 may be deposited over the top of the recess region 168 and the top surface S of the semiconductor substrate 102 to a thickness $T_{th}$ of about 30-120 nm. The recess region 168 and the STI region above the recess region 172 may be further utilized to fabricate additional structures such as other passive devices (e.g., resistors) and/or electrically conductive interconnections (e.g., wiring). Further, region 173 located on the surface $S_o$ of the STI fill material 165 may be used to include yet another passive device. The gaps $G_p$ of STI material located between regions 168, 172, 173, and capacitor device 150 provide vertical electrical isolation with respect to the devices formed within these regions. Thus, stacked passive devices such as capacitor device 150 and passive devices within regions 168, 172, and 173, may be created within the formed STI region 140.

Figure 1F:
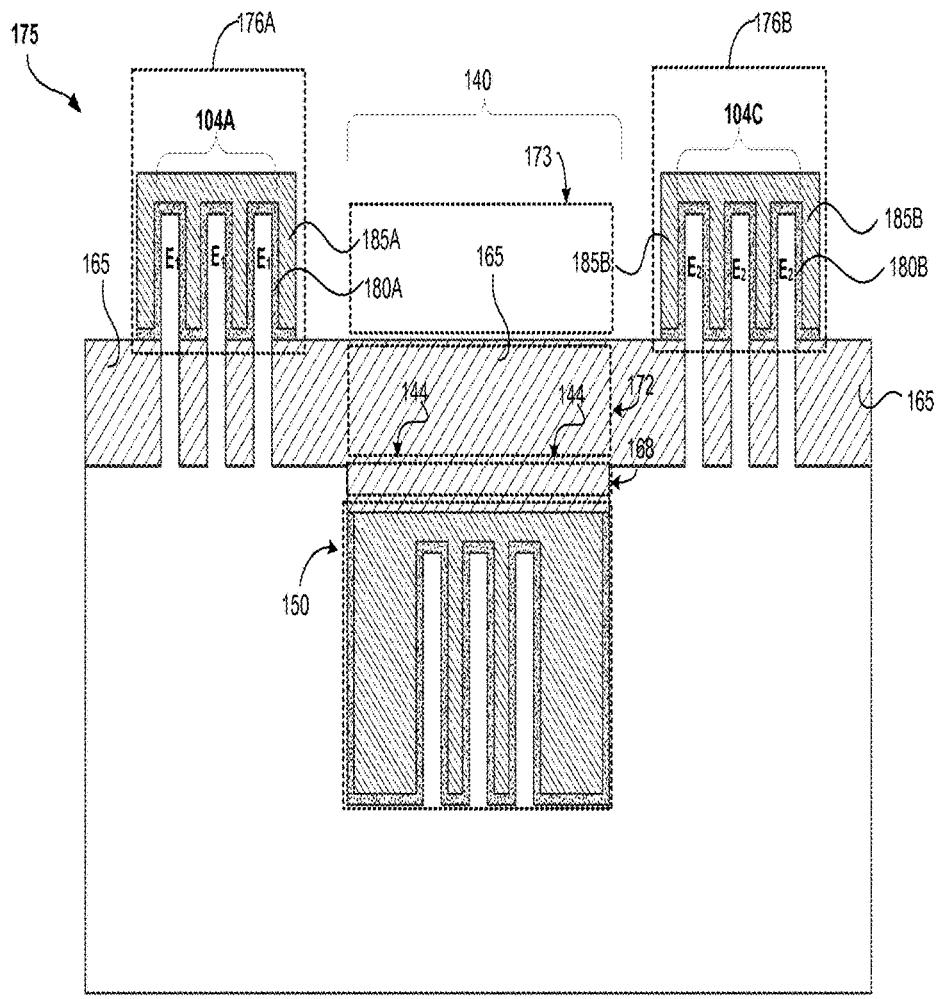
FIG. 1F illustrates a cross-sectional view of a semiconductor structure formed by creating finFET devices from the un-recessed fins of the semiconductor structure of FIG. 1E, according to one exemplary embodiment.

Referring to FIG. 1F, semiconductor structure 175 may be created by forming finFET devices 176A, 176B using the group of fins 104A, 104C of semiconductor structure 160 (FIG. 1E) according to one exemplary embodiment. In particular, as shown in FIG. 1F, a high-k dielectric layer 180A is deposited over the surface of group of fins 104A, while another high-k dielectric layer 180B is deposited over the surface of group of fins 104C. The high-k dielectric layers 180A, 180B thus form respective gate dielectrics for each of the finFET devices 176A, 176B. The high-k dielectric layers 180A, 180B may include high-k materials such as, but not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, and lead scandium tantalum oxide. The high-k dielectric layers 180A, 180B may further include dopants such as lanthanum, aluminum.

Further referring to FIG. 1F, gate electrode 185A is formed over high-k dielectric layer 180A of finFET device 176A, while gate electrode 185B is formed over high-k dielectric layer 180B of finFET device 176B. In some implementations, the formed gate electrodes 185A, 185B of the respective finFET devices 176A, 176B may include materials such as, but not limited to, polysilicon or amorphous silicon, germanium, silicon germanium, a metal (e.g., tungsten, titanium, tantalum, ruthenium, zirconium, cobalt, copper, aluminum, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The thickness of the gate dielectric layers 180A, 180B may, for example, be in the range of about 1.0 nm-5.0 nm. Gate electrodes 185A, 185B may have a thickness approximately in the range of about 20-100 nm and a length in the range of about 10-250 nm, although lesser and greater thicknesses and lengths may also be contemplated.

Source/drain regions (not shown) may be formed on end $E_1$ and the opposing end (not shown) to $E_1$ of the group of fins 104A associated with finFET device 176A. Similarly, Source/drain regions (not shown) may also be formed on end $E_2$ and the opposing end (not shown) to $E_2$ of the group of fins 104C associated with finFET device 176B.

For example, for a pFET finFET device, the source/drain regions corresponding to end $E_2$ and the opposing end (not shown) to $E_2$ may include a silicon germanium (SiGe) type material, where the atomic concentration of germanium (Ge) may range from about 10-100%, preferably from about 20-60%. In a preferred exemplary embodiment, the concentration of germanium (Ge) may be 50%. SiGe may provide a compressive strain. Thus, the SiGe source/drain regions may exerts a longitudinal compressive strain in the direction of each channel region formed by the fin groups 104A. Dopants such as boron may be incorporated into the SiGe source/drain regions by in-situ doping. The percentage of boron may range from $1E19\,cm^{-3}$ to $2E21\,cm^{-3}$, preferably $1E20\,cm^{-3}$ to $1E21\,cm^{-3}$. In a preferred exemplary embodiment, the percentage of boron may range from $4E20\,cm^{-3}$ to $7E20\,cm^{-3}$.

Alternatively, for a nFET finFET device, the source/drain regions corresponding to end $E_1$ and the opposing end (not shown) to $E_1$ may include a carbon doped Silicon (Si:C) type material, where the atomic concentration of carbon (C) may range from about 0.4-3.0%, preferably from about 0.5-2.5%. In a preferred exemplary embodiment, the concentration of carbon (C) may be approximately 1.5-2.2%. Si:C provides a tensile strain. Thus, the Si:C source/drain regions may exert a longitudinal tensile strain in each channel region formed by fin groups 104C. Dopants such as phosphorous or arsenic may be incorporated into the Si:C source/drain regions by in-situ doping. The percentage of phosphorous or arsenic may range from $1E19\,cm^{-3}$ to $2E21\,cm^{-3}$, preferably $1E20\,cm^{-3}$ to $1E21\,cm^{-3}$. In a preferred exemplary embodiment, the percentage of boron may range from $4E20\,cm^{-3}$ to $7E20\,cm^{-3}$.

Figure 2A:
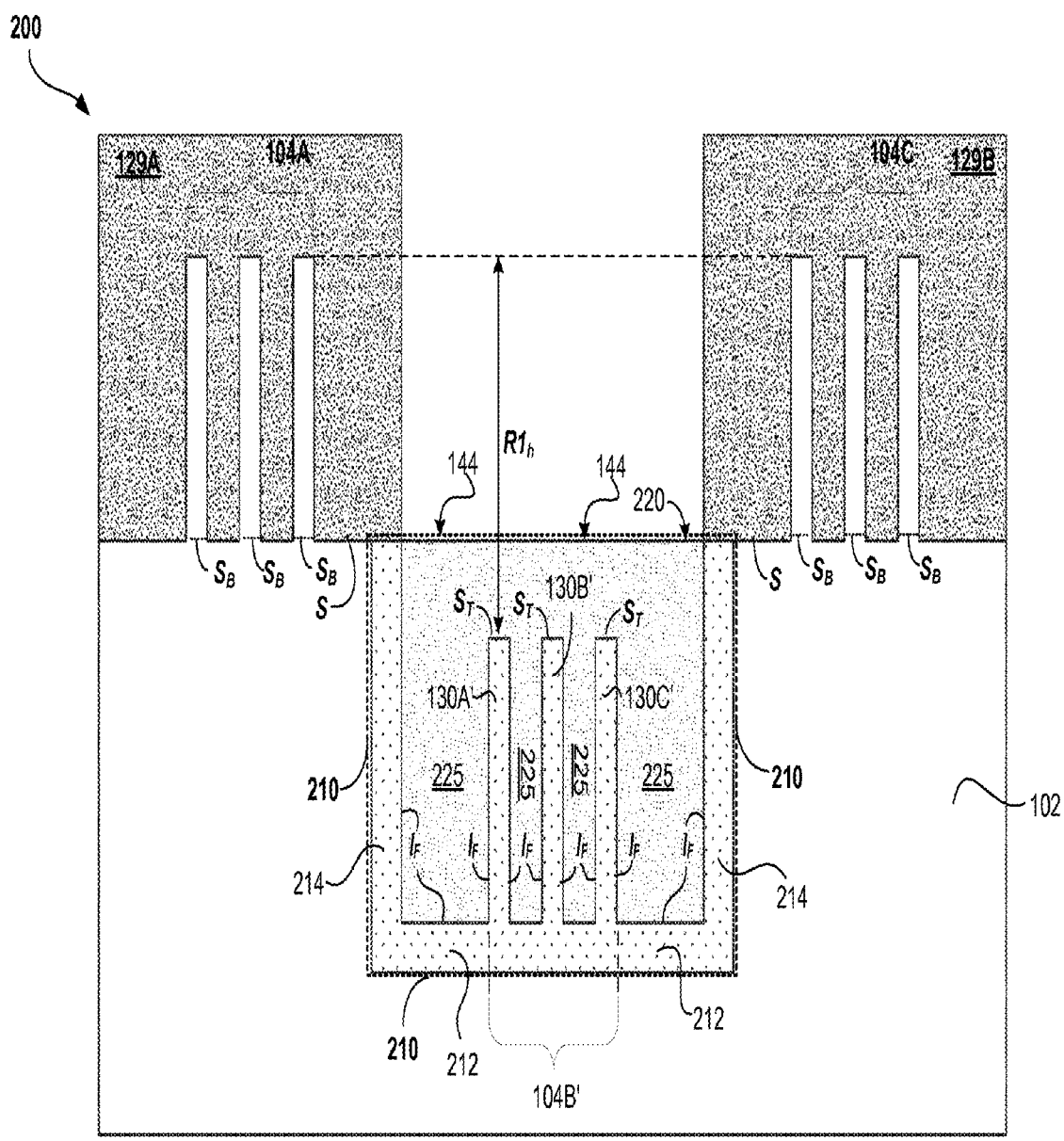
FIG. 2A illustrates a cross-sectional view of a semiconductor structure formed by creating a buried diode within the recessed group of fins of the semiconductor structure of FIG. 1C, according to one exemplary embodiment.
Figure 2B:
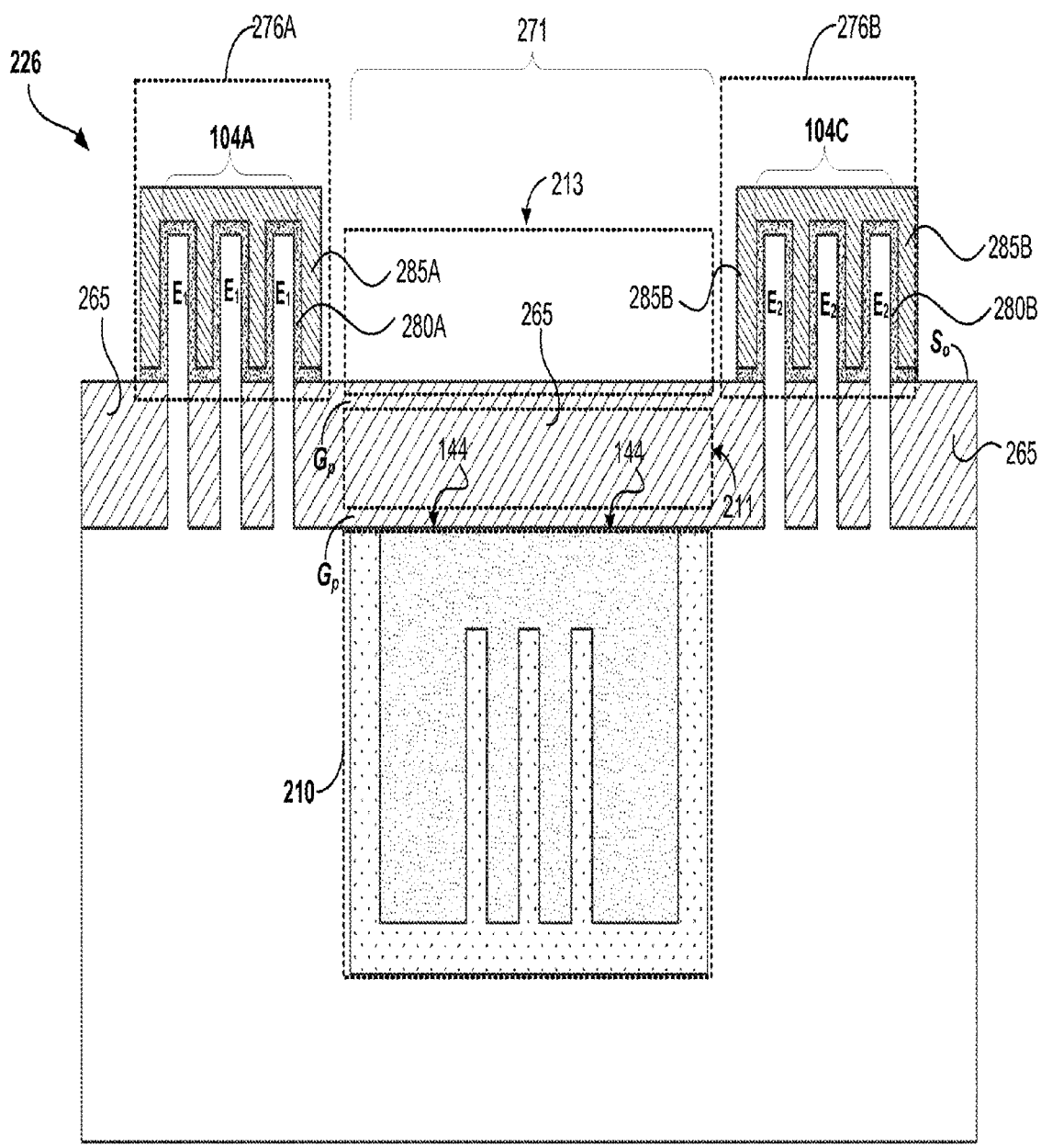
FIG. 2B illustrates a cross-sectional view of a semiconductor structure formed by creating finFET devices from the un-recessed group of fins of the semiconductor structure of FIG. 2A, according to one exemplary embodiment.

FIGS. 2A-2B are cross sectional views corresponding to the fabrication of a semiconductor structure having active finFET devices and a passive diode device, according to another exemplary embodiment.

Referring to FIG. 2A, a semiconductor structure 200 including a diode device 210 fabricated using group of fins 104B' is depicted according to one exemplary embodiment. Semiconductor structure 200 may be formed from structure 135 (FIG. 1C), whereby, as previously described, using a silicon RIE etching process, the passive fins 130A'-130C' are recessed by height $R1_h$ (e.g., 70 nm-220 nm or more) such that the top surfaces $S_T$ of the passive fins 130A'-130C' are now located below the bottom surfaces $S_B$ of the active group of fins 104A, 104C protected by hardmask regions 129A and 129B. Thus, since the active group of fins 104A, 104C are protected by hardmask regions 129A and 129B, they remain un-etched and do not recess below the surface S of the semiconductor substrate 102, as with the passive fins 130A'-130C' of fin group 130B'.

As further depicted in FIG. 2A, the passive fins 130A'-130C', the floor region 212 of the STI trench 144, and the sidewall regions 214 of the STI trench 144 are doped with, for example, phosphorous (P) or Arsenic (As) in order to form a N-doped region. The (P) or (As) dopant concentration may, for example, range from $1E18\,cm^{-3}$ to about $1E20\,cm^{-3}$. Once the N-doped region is formed from the passive fins 130A'-130C', the floor region 212 of the STI trench 144, and the sidewall regions 214 of the STI trench 144, an epitaxial P-type region 225 is grown over the N-doped region up to the top 220 of the STI trench 144. The epitaxial P-type region 225 may be formed by the epitaxial deposition of silicon (Si) or silicon Germanium (SiGe) with in-situ Boron (B) doping. The Boron dopant concentration may, for example, range from $1E18\,cm^{-3}$ to about $1E21\,cm^{-3}$. Any suitable doping process such as, but not limited to, ion implantation, plasma doping, solid phase doping, liquid phase doping, in-situ doped epitaxy, etc. may be incorporated in the formation of the N-doped and P-doped regions described above.

The interfaces $I_F$ between the P-type region 225 and the N-doped region including the passive fins 130A'-130C', floor region 212, and sidewall regions 214 may form PN junctions for the diode 210. As depicted, the diode 210 is formed within STI trench 144 and embedded within the semiconductor substrate 102. Embedding devices in the STI trench 144 provides efficient utilization of the STI space used to isolate adjacent active devices such as, for example, P-type finFETs (e.g., see FIG. 2B: device 276B) and N-type finFETs (e.g., see FIG. 2B: device 276A). However, in addition, the embedding of the devices in the substrate 102 provides improved heat dissipation compared to devices located on top of the substrate 102 that dissipate heat through the air or dielectric materials surrounding them. For example, the silicon material of the substrate 102 provides better heat conduction and, therefore, dissipation of heat, compared to air or dielectric oxide. In the case where the substrate 102 is a single-crystal, another advantage of having the devices in the substrate is to have those devices as single-crystal devices.

Referring to FIG. 2B, semiconductor structure 226 may be created by forming finFET devices 276A, 276B using the group of fins 104A, 104C of semiconductor structure 200 (FIG. 2A) according to one exemplary embodiment. In particular, as shown in FIG. 2A, a high-k dielectric layer 280A is deposited over the surface of group fins 104A, while another high-k dielectric layer 280B is deposited over the surface of group fins 104B. The high-k dielectric layers 280A, 280B thus form respective gate dielectrics for each of the finFET devices 276A, 276B. The high-k dielectric layers 280A, 280B may include high-k materials such as, but not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, and lead scandium tantalum oxide. The high-k dielectric layers 280A, 280B may further include dopants such as lanthanum, aluminum.

Further referring to FIG. 2B, gate electrode 285A is formed over high-k dielectric layer 280A of finFET device 276A, while gate electrode 285B is formed over high-k dielectric layer 280B of finFET device 276B. In some implementations, the formed gate electrodes 285A, 285B of the respective finFET devices 276A, 276B may include materials such as, but not limited to, polysilicon or amorphous silicon, germanium, silicon germanium, a metal (e.g., tungsten, titanium, tantalum, ruthenium, zirconium, cobalt, copper, aluminum, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The thickness of the gate dielectric layers 280A, 280B may, for example, be in the range of about 1.0 nm-5.0 nm. Gate electrodes 285A, 285B may have a thickness approximately in the range of about 20-100 nm and a length in the range of about 10-250 nm, although lesser and greater thicknesses and lengths may also be contemplated.

Source/drain regions (not shown) may be formed on end $E_1$ and the opposing end (not shown) to $E_1$ of the group of fins 104A associated with finFET device 276A. Similarly, Source/drain regions (not shown) may also be formed on end $E_2$ and the opposing end (not shown) to $E_2$ of the group of fins 104C associated with finFET device 276B.

For example, for a pFET finFET device, the source/drain regions corresponding to end $E_2$ and the opposing end (not shown) to $E_2$ may include a silicon germanium (SiGe) type material, where the atomic concentration of germanium (Ge) may range from about 10-100%, preferably from about 20-60%. In a preferred exemplary embodiment, the concentration of germanium (Ge) may be 50%. SiGe may provide a compressive strain. Thus, the SiGe source/drain regions may exerts a longitudinal compressive strain in the direction of each channel region formed by the fin groups 104A. Dopants such as boron may be incorporated into the SiGe source/drain regions by in-situ doping. The percentage of boron may range from $1E19\,cm^{-3}$ to $2E21\,cm^{-3}$, preferably $1E20\,cm^{-3}$ to $1E21\,cm^{-3}$. In a preferred exemplary embodiment, the percentage of boron may range from $4E20\,cm^{-3}$ to $7E20\,cm^{-3}$.

Alternatively, for a nFET finFET device, the source/drain regions corresponding to end $E_1$ and the opposing end (not shown) to $E_1$ may include a carbon doped Silicon (Si:C) type material, where the atomic concentration of carbon (C) may range from about 0.4-3.0%, preferably from about 0.5-2.5%. In a preferred exemplary embodiment, the concentration of carbon (C) may be approximately 1.5-2.2%. Si:C provides a tensile strain. Thus, the Si:C source/drain regions may exert a longitudinal tensile strain in each channel region formed by fin groups 104C. Dopants such as phosphorous or arsenic may be incorporated into the Si:C source/drain regions by in-situ doping. The percentage of phosphorous or arsenic may range from $1E19\,cm^{-3}$ to $2E21\,cm^{-3}$, preferably $1E20\,cm^{-3}$ to $1E21\,cm^{-3}$. In a preferred exemplary embodiment, the percentage of boron may range from $4E20\,cm^{-3}$ to $7E20\,cm^{-3}$.

The STI region 211 above the formed diode 210 may be further utilized to fabricate additional structures such as other passive devices (e.g., resistors) and/or electrically conductive interconnections (e.g., wiring). Further, region 213 located on the surface $S_o$ of the STI fill material 265 may be used to include yet another passive device. The gaps $G_p$ of STI material located between regions 211, 213, and diode device 210 provide vertical electrical isolation with respect to the devices within these regions. Thus, stacked passive devices such as diode device 210 and passive devices within regions 211 and 213, may be created within the formed STI region 271.

FIGS. 3A-3H are cross sectional views corresponding to the fabrication of a STI region with a flat bottom and a STI region with buried fins using different cut masks, according to one exemplary embodiment.

Figure 3A:
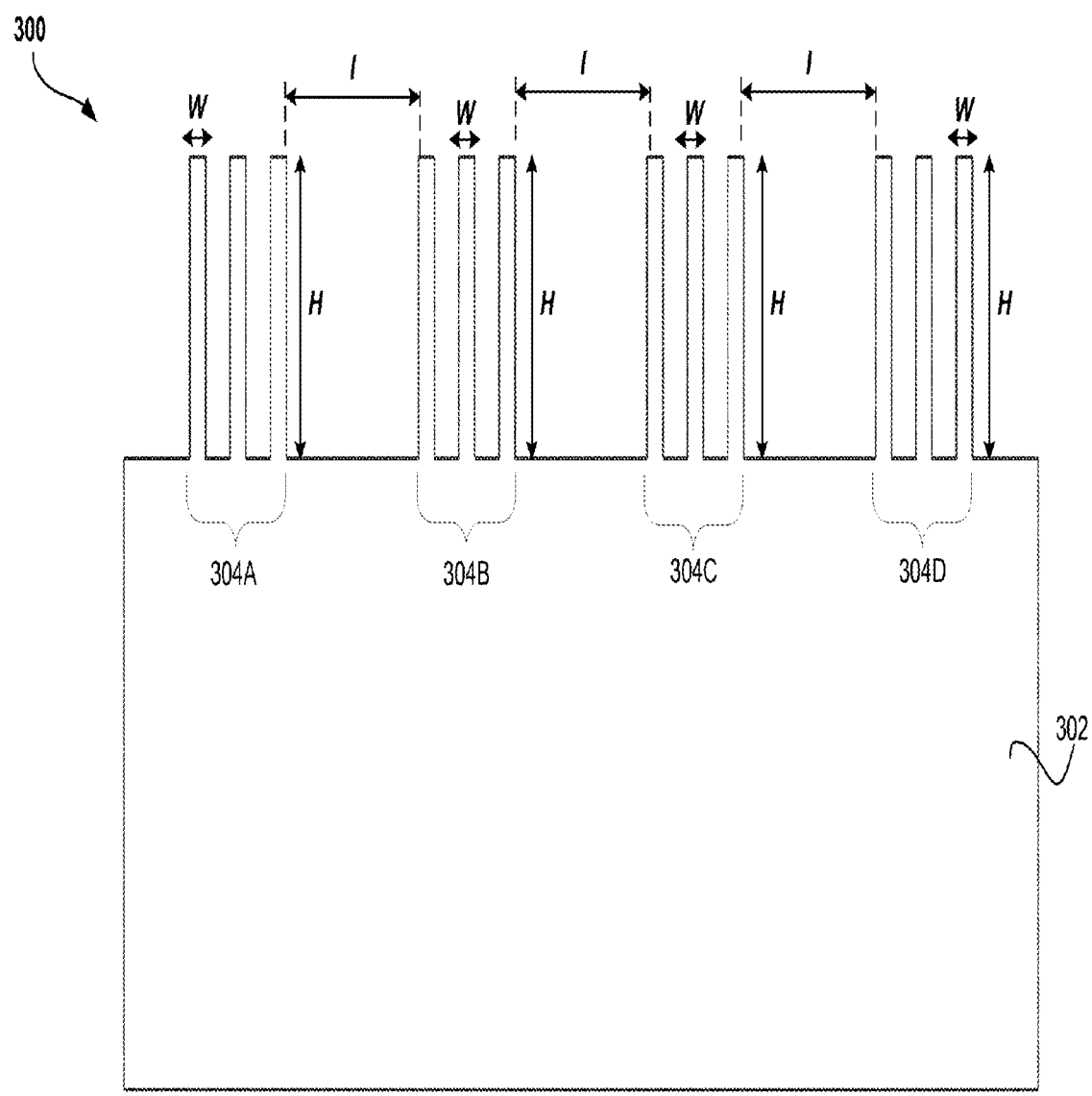
FIG. 3A illustrates a cross-sectional view of a semiconductor structure that includes a fabricated group of fins on a bulk semiconductor substrate, according to one exemplary embodiment.

Referring to FIG. 3A, a semiconductor structure 300 including a fabricated group of fins 304A-304D (i.e., 3 fins per group) on a bulk semiconductor substrate 302 according to one exemplary embodiment is depicted. It may be appreciated that in addition to a bulk semiconductor substrate 302, any other suitable substrate and/or substrate material may be used to form the group of fins 304A-304D. For example, semiconductor substrate 302 can be a bulk wafer formed of any conventional semiconductor substrate material including, but not limited to, silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and together summing to 1. Other suitable substrates may include II-VI compound semiconductors having a composition $Zn_{A1}Cd_{A2}Se_{B1}Te_{B2}$, where A1, A2, B1, and B2 are relative proportions each greater than or equal to zero and sum to 1. Other substrates used to form semiconductor structure 300 may, for example, include silicon-on-insulator (SOI) substrates or extremely-thin-silicon-insulator (ETSOI) type substrates.

As depicted in FIG. 3A, each of the fins corresponding to the group of fins 304A-304D (i.e., 3 fins per group) may have a height H in the range of about 50 nm-100 nm, although lessor or greater heights may be contemplated. Further, each of the fins corresponding to the group of fins 304A-304D (i.e., 3 fins per group) may have a width W in the range of about 5 nm-30 nm, although lessor or greater widths may be contemplated. The interval or separation S between each of the fins corresponding to the group of fins 304A-304D (i.e., 3 fins per group) may be about 10 nm-100 nm, although lessor or greater separations may be contemplated. The group of fins 304A-304D (i.e., 3 fins per group) may be created using know fabrication techniques. For example, fin groups 304A-304D may be formed from substrate 302 using a sidewall image transfer (SIT) fabrication process. Thus, lithographic patterning and reactive ion etching (RIE) techniques may be utilized. For illustrative non-limiting purposes, three (3) groups 304A-304D each having three fins are fabricated. However, any number of fin groups may be contemplated. The group 304A-304D may be separated by an interval separation I of about 30 nm-500 nm, although lessor or greater interval separations may be contemplated.

Figure 3B:
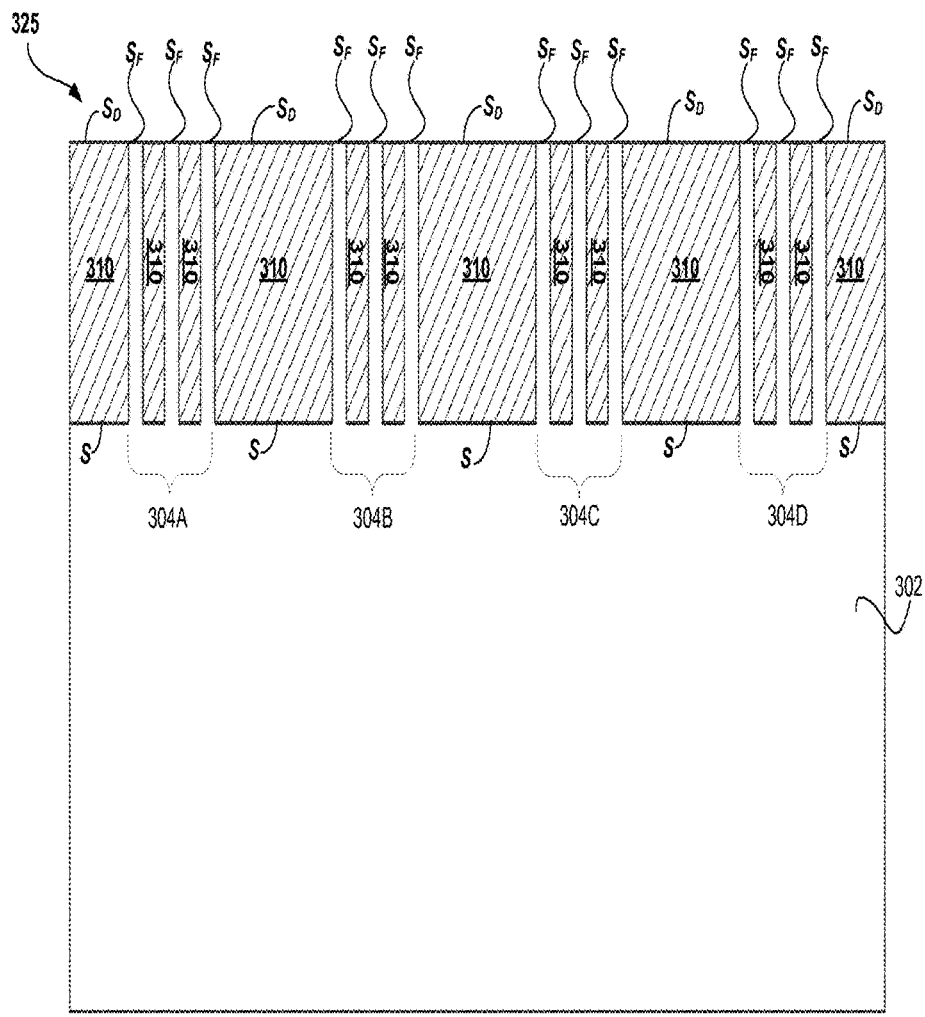
FIG. 3B illustrates a cross-sectional view of semiconductor structure formed by depositing a dielectric material layer over the semiconductor structure of FIG. 3A, according to one embodiment.

Referring to FIG. 3B, structure 325 may be formed by depositing a dielectric material layer 310 over the group of fins 304A-304D of semiconductor structure 300 (FIG. 3A) according to one embodiment. As depicted, a dielectric material layer 310 such as silicon dioxide ($SiO_2$) is deposited over the surface S of the semiconductor substrate 302 and over the group of fins 304A-304D. A chemical mechanical polishing (CMP) process may then be used to level the top surface $S_D$ of dielectric material layer 310 with the top surface $S_F$ of the group of fins 304A-304D.

Figure 3C:
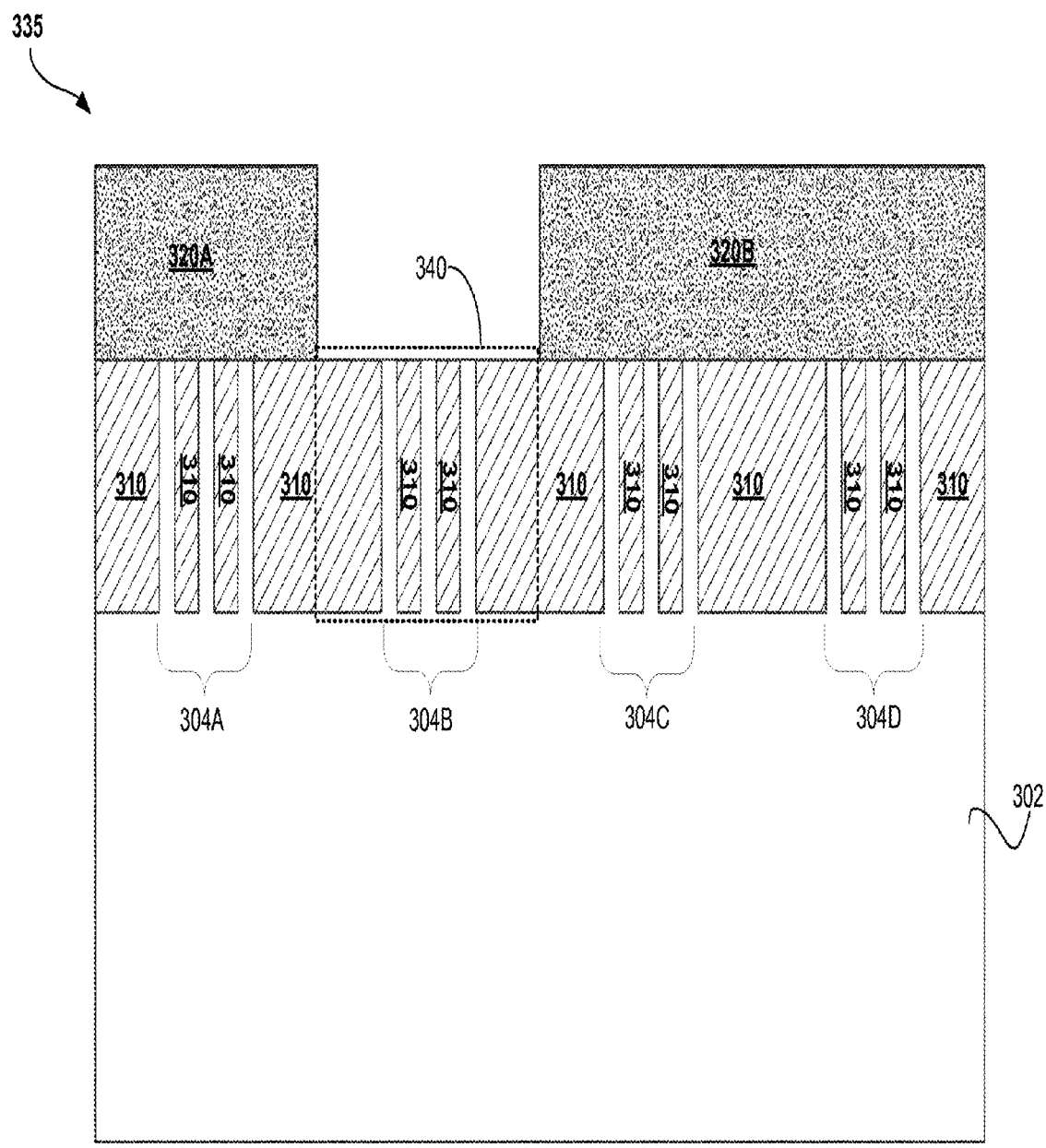
FIG. 3C illustrates a cross-sectional view of a semiconductor structure formed by applying a first patterned hardmask to the semiconductor structure of FIG. 3B, according to one exemplary embodiment.

Referring to FIG. 3C, structure 335 may be created by forming a photolithographically patterned hard mask layer having regions 320A and 320B over semiconductor structure 325 (FIG. 3B) according to one embodiment. Particularly, hardmask regions 320A and 320B form a first cut mask used to expose region 340, which includes group of fins 304B. Exposed region 340 may be utilized to form a flat bottom STI region, as illustrated and described in the following paragraphs. As depicted, however, hardmask region 320A protects group of fins 304A from subsequent etch processes, while hardmask region 320B protects group of fins 304C and 304D from being subsequently etched.

Figure 3D:
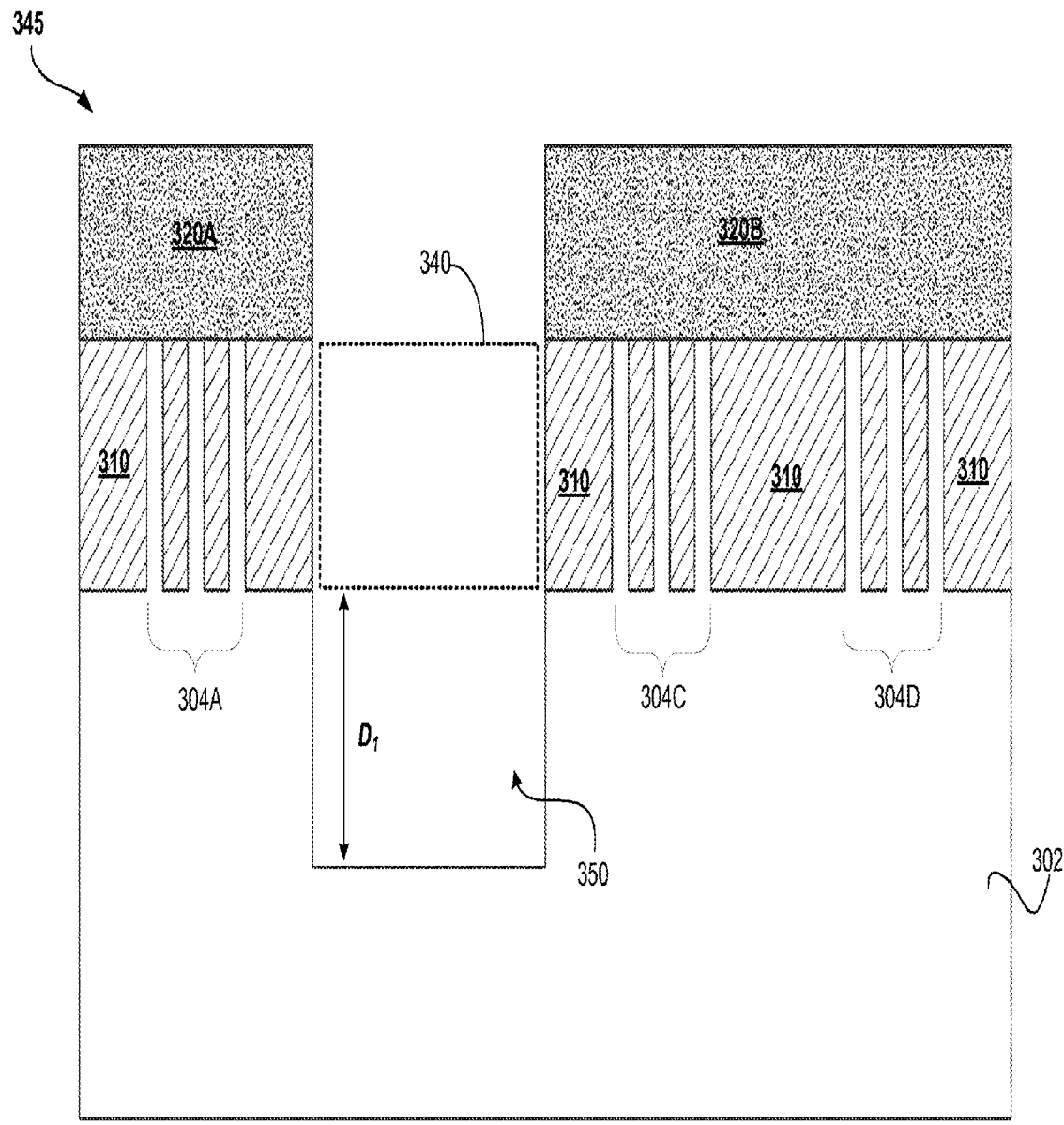
FIG. 3D illustrates a cross-sectional view of a semiconductor structure formed by etching an exposed region within the semiconductor structure of FIG. 3C, according to one exemplary embodiment.

Referring to FIG. 3D, structure 345 may be created by RIE etching exposed region 340 (FIG. 3C) of structure 335 (FIG. 3C), according to one embodiment. As depicted, the RIE process removes the group of fins 304B (FIG. 3C) from region 340 and further etches down into the semiconductor substrate 302 to a depth of $D_1$ to create a flat bottom STI trench 350.

Figure 3E:
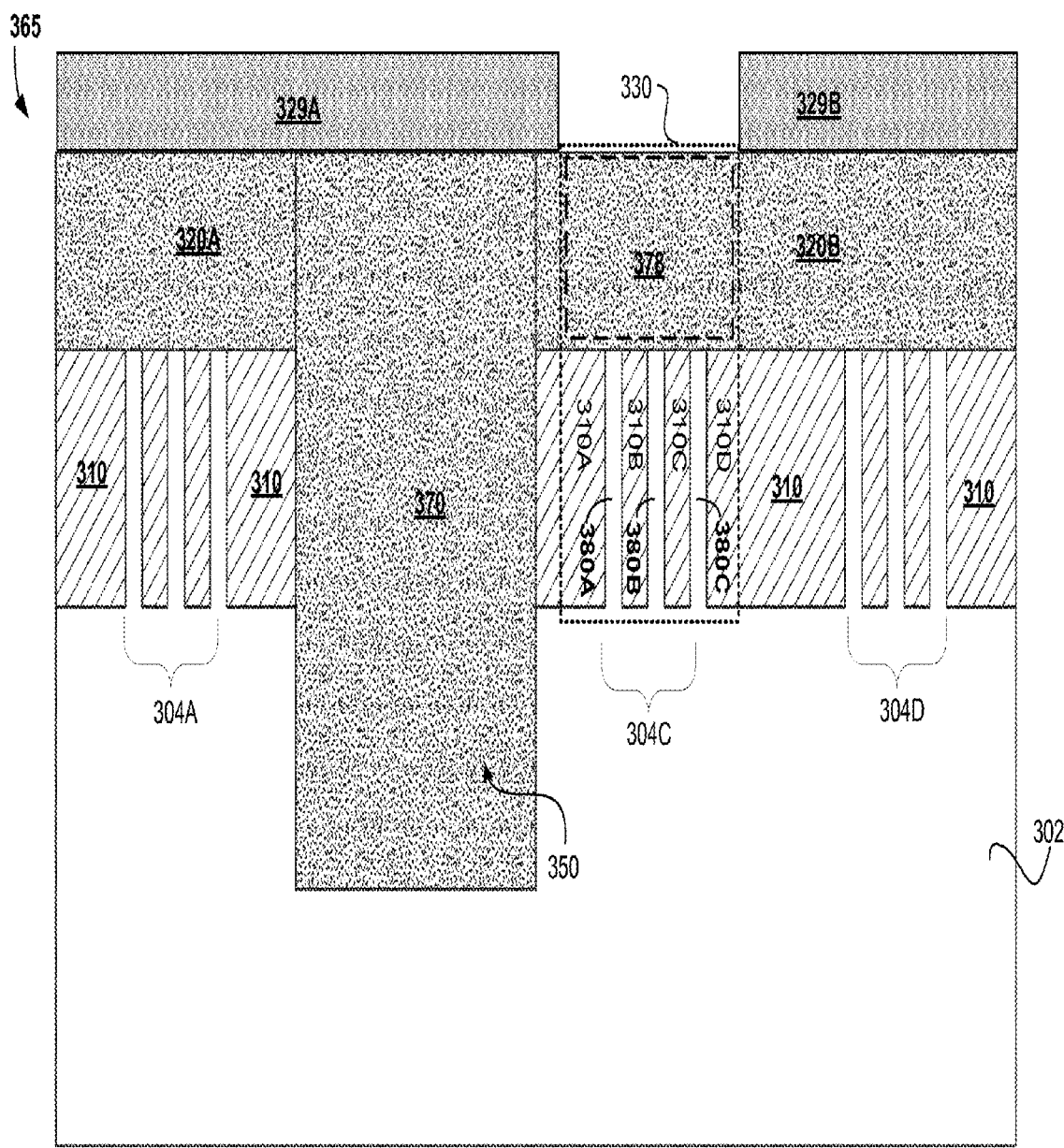
FIG. 3E illustrates a cross-sectional view of a semiconductor structure formed by creating a flat bottom STI trench from the etched exposed region of the semiconductor structure of FIG. 3D and further applying a second patterned hardmask to the semiconductor structure of FIG. 3D, according to one exemplary embodiment.

Referring now to FIG. 3E, structure 365 may be created by filling the created flat bottom STI trench 350 (FIG. 3D) of structure 345 (FIG. 3D) with a dielectric material 370 such as, for example, silicon nitride ($Si_3N_4$). As further illustrated, patterned hardmask regions 329A and 329B form a second cut mask over the first cut mask formed by hardmask regions 320A and 320B, and over the dielectric filled STI trench 350. The hardmask regions 329A, 329B may, for example, include a silicon nitride material ($Si_3N_4$). In particular, hardmask region 329A covers group of fins 304A and the dielectric filled STI trench 350, while hardmask region 329B covers group of fins 304D. The second cut mask, however, exposes region 330, which includes group of fins 304C. In the depicted embodiment, group of fins 304A and 304D, which are protected by respective hardmask regions 329A and 329B, may subsequently be used to form the active fins of finFET devices. Group of fins 304C may subsequently be used to form embedded passive devices such as capacitors, diodes, resistors, etc.

Figure 3F:
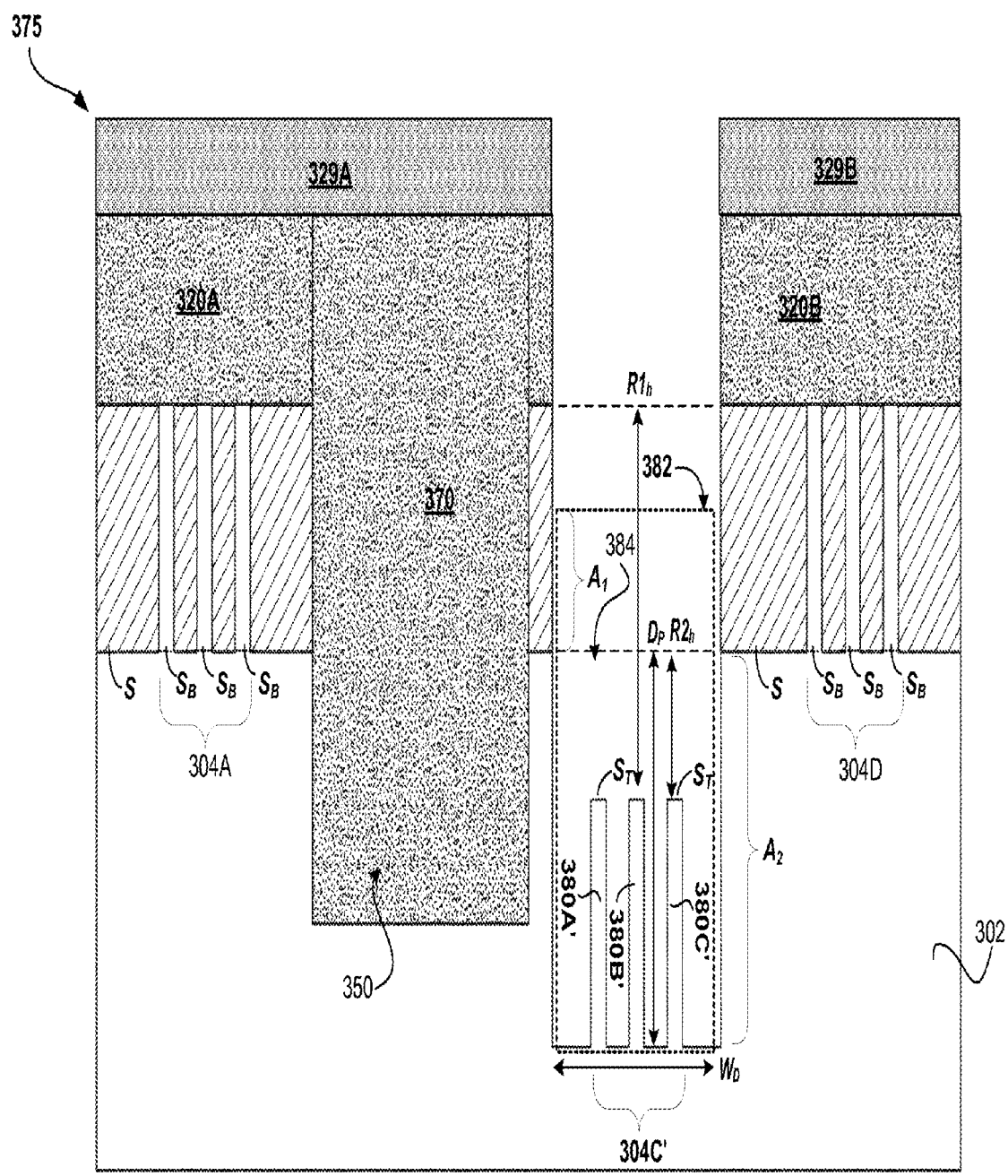
FIG. 3F illustrates a cross-sectional view of a semiconductor structure formed by recessing an exposed group of fins within the semiconductor structure of FIG. 3E, according to one exemplary embodiment.

Referring to FIG. 3F, semiconductor structure 375 may be formed by etching the exposed region 330 (FIG. 3E) of semiconductor structure 365 (FIG. 3E) according to one exemplary embodiment. Based on exposing region 330 (FIG. 3E), a dry etch process such as RIE, or a wet etch using phosphoric acid ($H_3PO_4$) may be utilized to remove hardmask material (e.g., $Si_3N_4$) region 378 (FIG. 3E) from exposed region 330 (FIG. 3E). For example, the RIE process may be selective to the silicon material forming the fins of fin group 304C (FIG. 3E) and substrate 302. Moreover, the dielectric fill regions 310A-310D (FIG. 3E) within the exposed region 330 (FIG. 3E) that surround fin group 304C (FIG. 3E) are also removed during the etching of hardmask region 378 (FIG. 3E).

Still referring to FIG. 3F, semiconductor structure 375 may be further formed by recessing the passive fins 380A-380C (FIG. 3E) corresponding to exposed group of fins 304C (FIG. 3E) according to one exemplary embodiment. In particular, FIG. 3F shows recessed passive fins 380A'-380C' corresponding to recessed group of fins 304C'. Using a silicon RIE etching process, the passive fins 380A'-380C' are recessed by height $R1_h$ (e.g., 70 nm-220 nm or more) such that the top surfaces $S_T$ of the passive fins 380A'-380C' are now located below the bottom surfaces $S_B$ of the active group of fins 304A, 304D protected by respective hardmask regions 329A and 329B. For example, as depicted, the top surfaces $S_T$ of the passive fins 380A'-380C' may be located below the bottom surfaces $S_B$ of the active group of fins 304A, 304D by height $R2_h$ (e.g., 20 nm or more). The bottom surfaces $S_B$ of the active group of fins 304A, 304D may coincide with the top surface S of the semiconductor substrate 302 such that surface S and $S_B$ exist on the same plane (i.e., coplanar).

As illustrated in FIG. 3F, region 382 may also be used to subsequently form an STI region for electrically isolating active group of fins 304A from active group of fins 304D. Thus, the recessed passive fins 380A'-380C' of the recessed group of fins 304C' are created within the STI region 382. The recessed group of fins 304C' are, therefore, embedded as a result being located below the bottom surfaces $S_B$ of the active group of fins 304A, 304D and below the top surface S of the semiconductor substrate 302. Due to the embedding of the recessed group of fins 304C', the recessed passive fins 380A'-380C' are thus located both within opening 384 of the semiconductor substrate 302 and below the top surface S of the semiconductor substrate 302. The STI region 382 may include an upper region, as indicated by $A_1$, and a lower region corresponding to trench opening 384 (i.e., STI trench), as determined by $A_2$. As depicted, the embedded group of fins 304C' within opening 384 is, therefore, located within the lower area $A_2$ of STI region 382. In particular, the embedded group of fins 304C' are located within and embedded by the trench opening or STI trench 384. Opening 384 may, for example, include a width $W_D$ of about 100 nm to 7000 nm and a depth $D_p$ of about 50-200 nm. The recessed group of fins 304C' embedded within STI trench 384 provide a three dimensional structure that enable the fabrication passive devices in relatively more confined spaces. For example, the passive fins 380A'-380C' may facilitate an increase in the surface area of capacitor plates compared to those implemented as a planar structure.

Figure 3G:
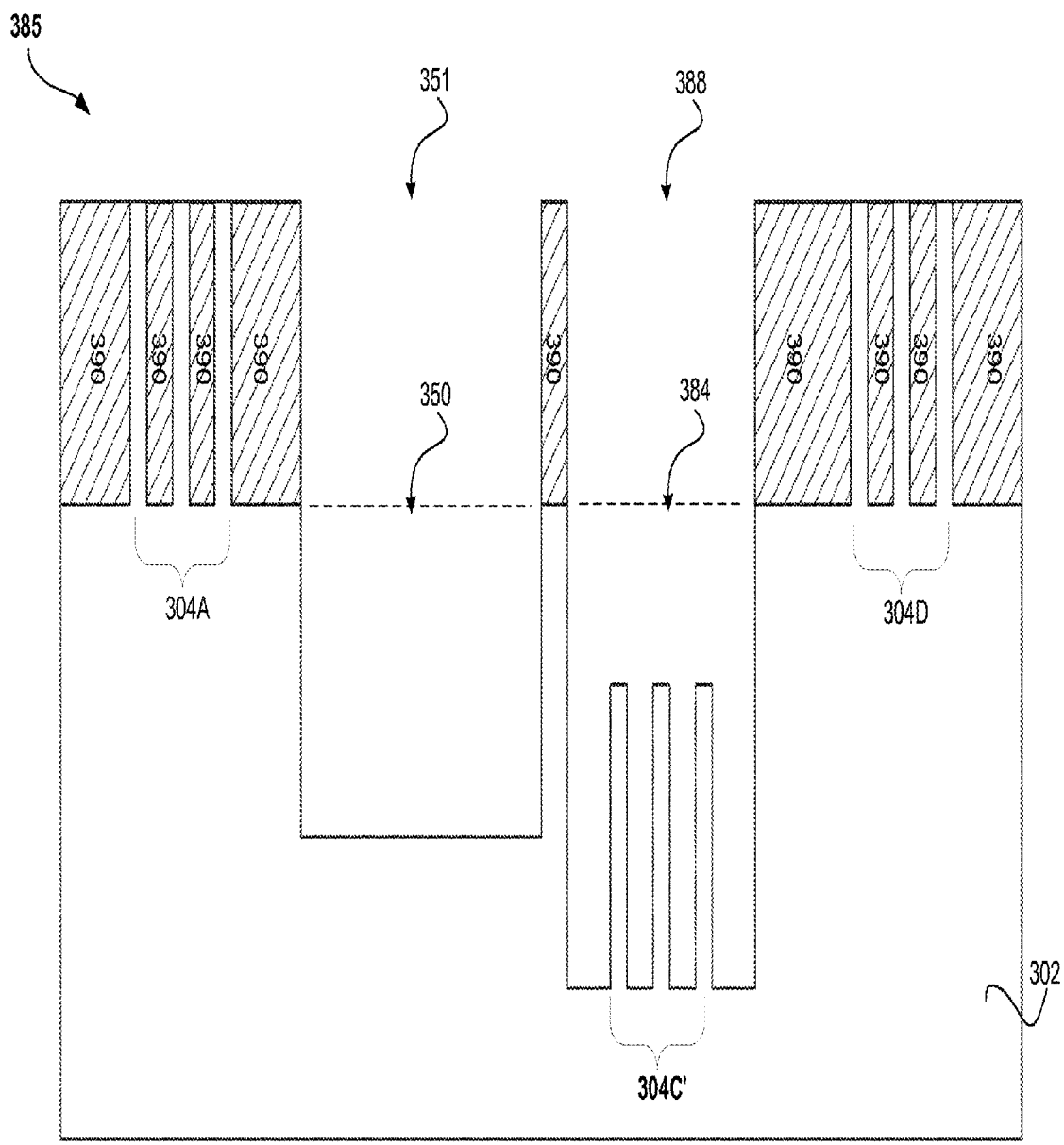
FIG. 3G illustrates a cross-sectional view of a semiconductor structure formed by removing the patterned hardmask regions from the semiconductor structure of FIG. 3F, according to one exemplary embodiment.

Referring to FIG. 3G, structure 385 may be formed by etching the silicon nitride regions 320A, 320B, 328A, 328B, 370 from structure 375, according to one embodiment. In particular, a RIE etch selective to silicon may be carried out in order to remove the silicon nitride ($Si_3N_4$) material from regions 320A, 320B, 329A, 329B, and 370 (FIG. 3F) of structure 375 (FIG. 3F). Thus, based on the selective etching, the silicon material corresponding to the fin groups 304A, 304D, 304C', the substrate 302, and the silicon dioxide fill regions 390 remain intact. As depicted in FIG. 3G, two adjacent STI trenches 350, 384 are formed. The first trench 350 formed by the first cut mask regions 320A, 320B is a flat bottom STI trench. The second trench 384 formed by the second cut mask regions 328A, 328B is a STI trench having an embedded fin structure 304C'.

Figure 3H:
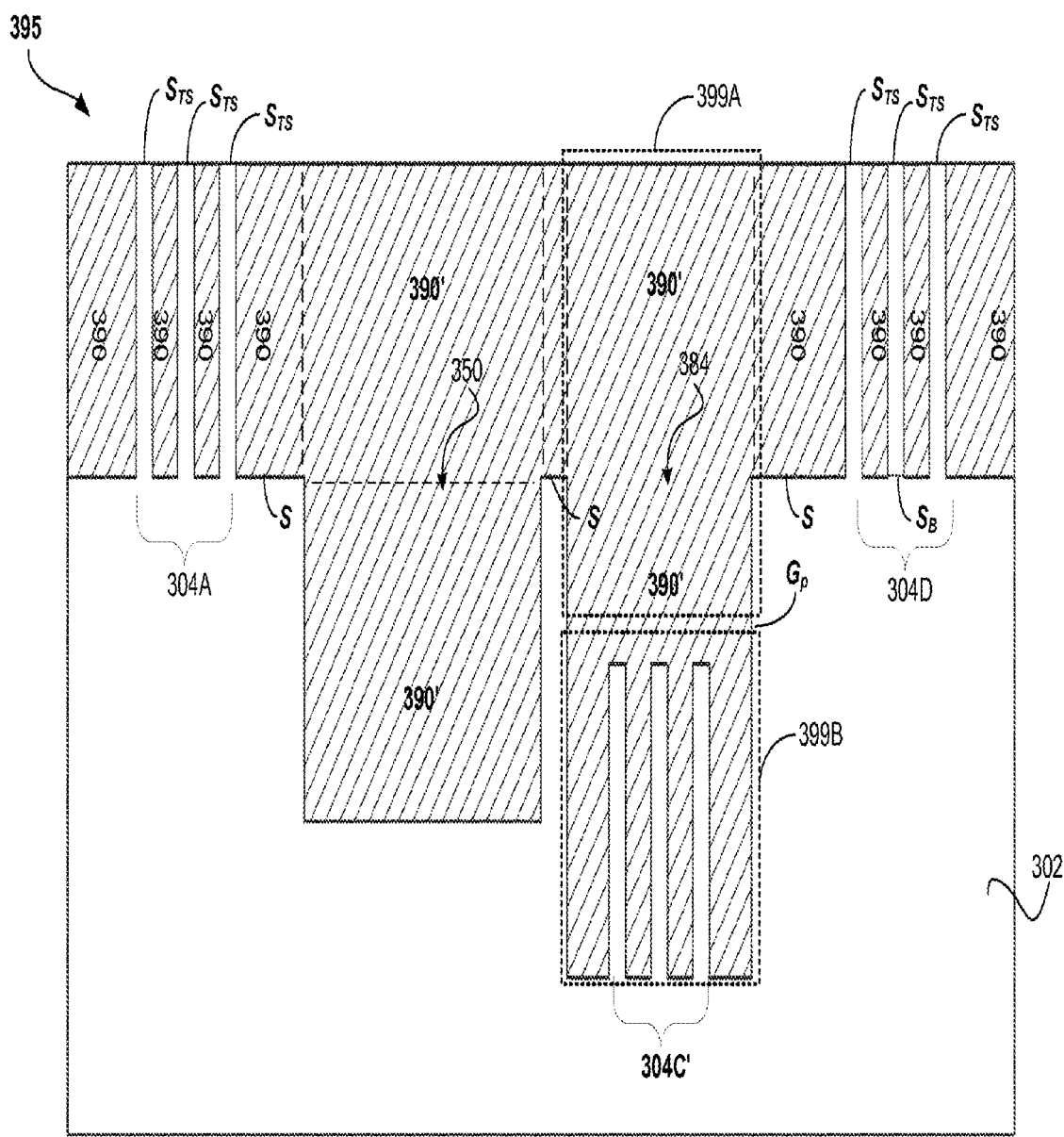
FIG. 3H illustrates a cross-sectional view of a semiconductor structure formed by depositing a STI dielectric material over the semiconductor structure of FIG. 3G to form a dual STI structure, according to one exemplary embodiment.

Referring to FIG. 3H, structure 395 may be formed by filling the two adjacent STI trenches 350, 384 with silicon dioxide ($SiO_2$) dielectric material 390'. The silicon dioxide ($SiO_2$) dielectric material is further deposited until the $SiO_2$ material 390' is approximately level with the top surfaces $S_{TS}$ of fin groups 304A and 304D. The exemplary embodiment of FIG. 3H includes two adjacent STI trenches 350, 384, which, according to one implementation may both serve to provide electrical isolation between any active devices (e.g., finFETs) formed using fin groups 304A and 304D. In an alternative implementation, the flat bottom STI trench 350 within STI region 351 (FIG. 3G) may serve as electrical isolation between active devices (e.g., finFETs) formed using fin groups 304A and 304D. In this implementation, within STI region 388 (FIG. 3G), the STI trench 384 having embedded fin structure 304C' may serve to provide one or more (i.e., multi-levels) passive structures. For example, using the processes described above in relation to FIGS. 2 & 3, the embedded fin structure 304C' may be used to form an embedded passive device such as a capacitor or diode structure. The passive device is embedded by virtue of, for example, being located within substrate 302 and being located below both the surface S of the substrate 302 and the bottom surface $S_B$ of the fin groups 304A, 304D used to form active 3-dimensional structures such as finFETs. Moreover, within region 399A, other passive devices such as resistors or electrical conductors (e.g., wiring, vias, electrical connectors, etc.) may be stacked above a region 399B used to form an embedded passive 3-dimensional structure (e.g., capacitor or diode, etc.) from fin group or fin structure 304C'. As depicted, stacked regions 399A and 399B may each include passive devices that are vertically electrically isolated from each other by the $SiO_2$ material 390' located within the gaps $G_p$ between these regions 399A, 399B.

Figure 4:
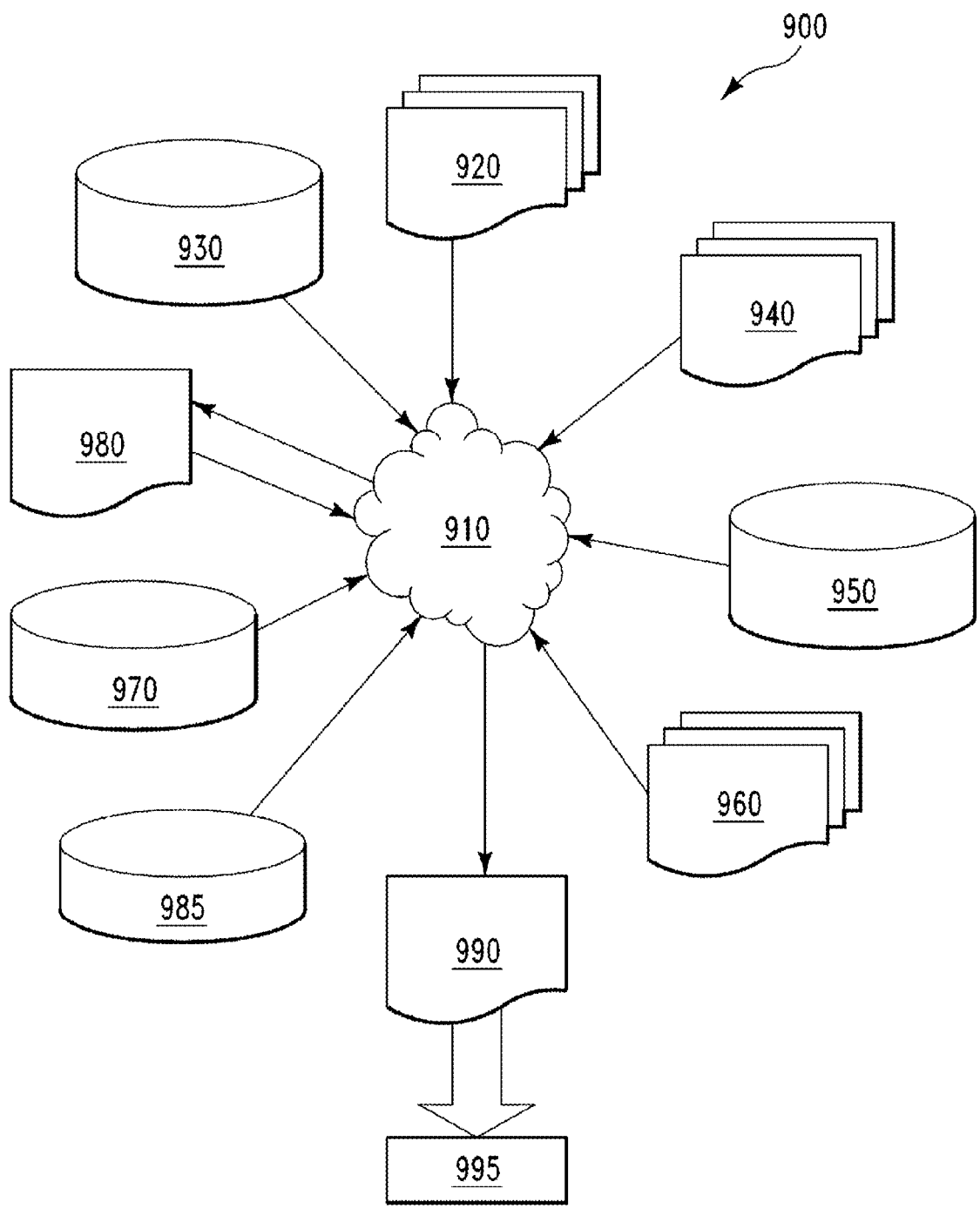
FIG. 4 is a flow diagram of a design process used in semiconductor design, manufacture, and/or test.

FIG. 4 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1F, 2B & 3H. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 920 that is preferably processed by a design process 910. In one embodiment, the design structure 920 includes design data used in a design process and comprising information describing embodiments of the invention with respect to the structures as shown in FIGS. 1F, 2B & 3H. The design data in the form of schematics or HDL, a hardware-description language (e.g., Verilog, VHDL, C, etc.) may be embodied on one or more machine readable media. For example, design structure 920 may be a text file, numerical data or a graphical representation of the embodiments of the invention, as shown in FIGS. 1F, 2B & 3H. Design structure 920 may be a logical simulation design structure generated and processed by design process 910 to produce a logically equivalent functional representation of a hardware device. Design structure 920 may also or alternatively include data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as that shown in FIGS. 1F, 2B & 3H. As such, design structure 920 may include files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1F, 2B & 3H to generate a netlist 980 which may contain a design structure such as design structure 920. Netlist 980 may include, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably includes one or more files, data structures, or other computer-encoded data or instructions that reside on transmission or data storage media and that when processed by an ECAD system generate a logically or otherwise functionally equivalent form of one or more of the embodiments of the invention shown in FIGS. 1F, 2B & 3H. In one or more embodiments, design structure 990 may include a compiled, executable HDL simulation model that functionally simulates the devices shown in FIGS. 1F, 2B & 3H.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may include information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 1F, 2B & 3H. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more described embodiment, the practical application or technical improvement over technologies found in the marketplace, or to enable other of ordinary skill in the art to understand the one or more embodiments disclosed herein.

What is claimed is:

1. A semiconductor structure comprising:
   a semiconductor substrate;
   a first group of fins associated with a first device located on the semiconductor substrate;
   a second group of fins associated with a second device located on the semiconductor substrate;
   a shallow trench isolation (STI) region having a trench opening within the semiconductor substrate, the trench opening located between the first group of fins and the second group of fins; and
   a third group of fins associated with a third device located within the trench opening, the third group of fins having a fin top surface located below a top surface of the semiconductor substrate, the top surface of the semiconductor substrate being substantially coplanar with a fin bottom surface corresponding to the first and the second group of fins, and wherein the third device is embedded within the trench opening.

2. The structure of claim 1, wherein the first device comprises a N-type finFET device, the second device comprises a P-type finFET device, and the third device comprises a passive device having structure formed from the third group of fins.

* * * * *